(12) United States Patent
D'Elia et al.

(10) Patent No.: US 7,084,074 B1
(45) Date of Patent: Aug. 1, 2006

(54) CVD GAS INJECTOR AND METHOD THEREFOR

(75) Inventors: Michael J. D'Elia, Austin, TX (US); Barry Sheffield, Austin, TX (US); Raymond Branstetter, Georgetown, TX (US); Jayendra D. Bhakta, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 755 days.

(21) Appl. No.: 09/575,349

(22) Filed: May 19, 2000

(51) Int. Cl.
*H01L 21/31* (2006.01)

(52) U.S. Cl. ..................... 438/758; 438/711
(58) Field of Classification Search ............. 438/758, 438/711
See application file for complete search history.

(56) References Cited

U.S. PATENT DOCUMENTS

| 5,015,330 | A | * | 5/1991 | Okumura et al. ........... 438/694 |
| 5,710,073 | A | * | 1/1998 | Jeng et al. .................. 438/239 |
| 6,143,080 | A | * | 11/2000 | Bartholomew et al. ..... 118/718 |

* cited by examiner

*Primary Examiner*—Phat X. Cao
*Assistant Examiner*—Theresa T. Doan
(74) *Attorney, Agent, or Firm*—Crawford Maunu PLLC

(57) ABSTRACT

Chemical vapor deposition (CVD) is enhanced by compensating for a depleted gas concentration zone in a CVD reactor. According to an example embodiment of the present invention, a chemical-vapor deposition (CVD) gas injector is adapted to supply gas to a CVD chamber in a manner that enhances the properties of deposited films. The injector has a gas inlet coupled to a gas source and supplies gas from the source to the CVD system via at least one gas outlet. The injector is adapted to deliver gas in a manner that sufficiently maintains uniform supply of the gas in a zone of the CVD system that would exhibit a depleted gas supply absent the injector. The uniform gas supply improves the CVD process in various manners, including making possible the deposition of films having uniform properties, such as reflectivity, extinction coefficient, thickness and refractive index.

13 Claims, 4 Drawing Sheets

CVD GAS INJECTOR AND METHOD THEREFOR

FIELD OF THE INVENTION

The present invention relates generally to chemical vapor deposition (CVD) and, more particularly, to semiconductor devices and their manufacture involving the deposition of a coating on an integrated circuit die.

BACKGROUND OF THE INVENTION

The semiconductor industry has recently experienced technological advances that have permitted dramatic increases in circuit density and complexity, and equally dramatic decreases in power consumption and package sizes. Present semiconductor technology now permits single-chip microprocessors with many millions of transistors, operating at speeds of hundreds of millions of instructions per second to be packaged in relatively small, air-cooled semiconductor device packages. These technological advances have fueled an increased demand for semiconductor devices and products that employ semiconductor devices. A byproduct of this increased demand has been a need to manufacture semiconductor devices having uniform circuit dimensions in an efficient manner as considerations including device speed, reliability and affordability become increasingly important.

One example manufacturing process used in the manufacture of semiconductor devices that affects such considerations includes chemical vapor deposition (CVD). In a typical CVD process, reactant gas is introduced to a chamber containing a semiconductor wafer. The gas is decomposed and reacted at a surface of the wafer to form a thin film of material such as silicon nitride, silicon dioxide or polycrystalline silicon. Many variations in the CVD processing can be used to achieve selected purposes. For more information regarding CVD, reference may be made to 1 S. WOLF & R. N. TAUBER, SILICON PROCESSING FOR THE VLSI ERA—PROCESS TECHNOLOGY 161–197 (1986).

CVD and other film deposition processes have been useful for various types of processes including semiconductor fabrication. However, the demands for improved products continue to present challenges to these and other processes. For example, as semiconductor die circuitry and other structures are scaled to a submicron scale, controlling their dimensions becomes increasingly challenging. One manner in which semiconductor structures are formed includes depositing a film on a semiconductor wafer to be used in controlling the structure dimensions. However, forming films having uniform thickness and/or other properties can be difficult.

In the CVD process, thickness, refractive index, extinction coefficient and other film properties are dependent upon deposition conditions including the concentration, residence time and pressure at which materials are supplied to the deposition process. These conditions are dependent upon the CVD process and the chamber characteristics. In some instances, chamber characteristics make it difficult to obtain a uniform gas supply.

For example, as reaction products are pumped from a CVD chamber during semiconductor wafer manufacturing processes, the pumping action may tend to draw reaction gasses from portions of the chamber in an uneven manner, which in turn affects the deposition conditions. When certain portions of the CVD chamber experience insufficient gas supply, these portions, sometimes including half or more of the chamber, can become unsuitable for CVD. This often means that fewer semiconductor wafers can be processed in the chamber, thereby decreasing output and adding time, materials, labor and overall expense to the wafer manufacturing process. Using existing CVD processes and systems, maintaining a uniform supply of gas over the surface upon which a film is being formed and maintaining uniform process conditions can be difficult or even impossible.

SUMMARY OF THE INVENTION

The present invention is directed to the deposition of a film upon a semiconductor wafer, and is exemplified in a number of implementations and applications, some of which are summarized below.

According to an example embodiment of the present invention, a chemical-vapor deposition (CVD) gas injector is adapted to supply gas to a CVD chamber in a manner that enhances the properties of deposited films. The injector has a gas inlet coupled to a gas source and supplies gas from the source to the CVD system via at least one gas outlet. The outlet shape and injector size are adapted to deliver supply gas in a manner that sufficiently maintains uniform delivery of the gas in a zone of the CVD system that would exhibit a depleted supply gas concentration absent the injector.

According to another example embodiment of the present invention, a CVD system is adapted to deposit a coating on a surface of a semiconductor wafer in a deposition chamber in the CVD system. The system includes a gas source and a gas injector adapted to deliver supply gas from the source to the CVD chamber through one or more gas outlets. The CVD chamber generates conditions suitable for CVD of the coating. An exhaust pump is coupled to the CVD chamber and adapted to pump gas including reaction byproducts from the chamber. The pumping of these gases can cause a depletion of the supply gas in regions of the chamber. The gas injector is adapted to compensate for the depletion of supply gas so that the surface of the wafer receives gas at uniform delivery and pressure during formation of the wafer coating.

The above summary of the present invention is not intended to describe each illustrated embodiment or every implementation of the present invention. The figures and detailed description that follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
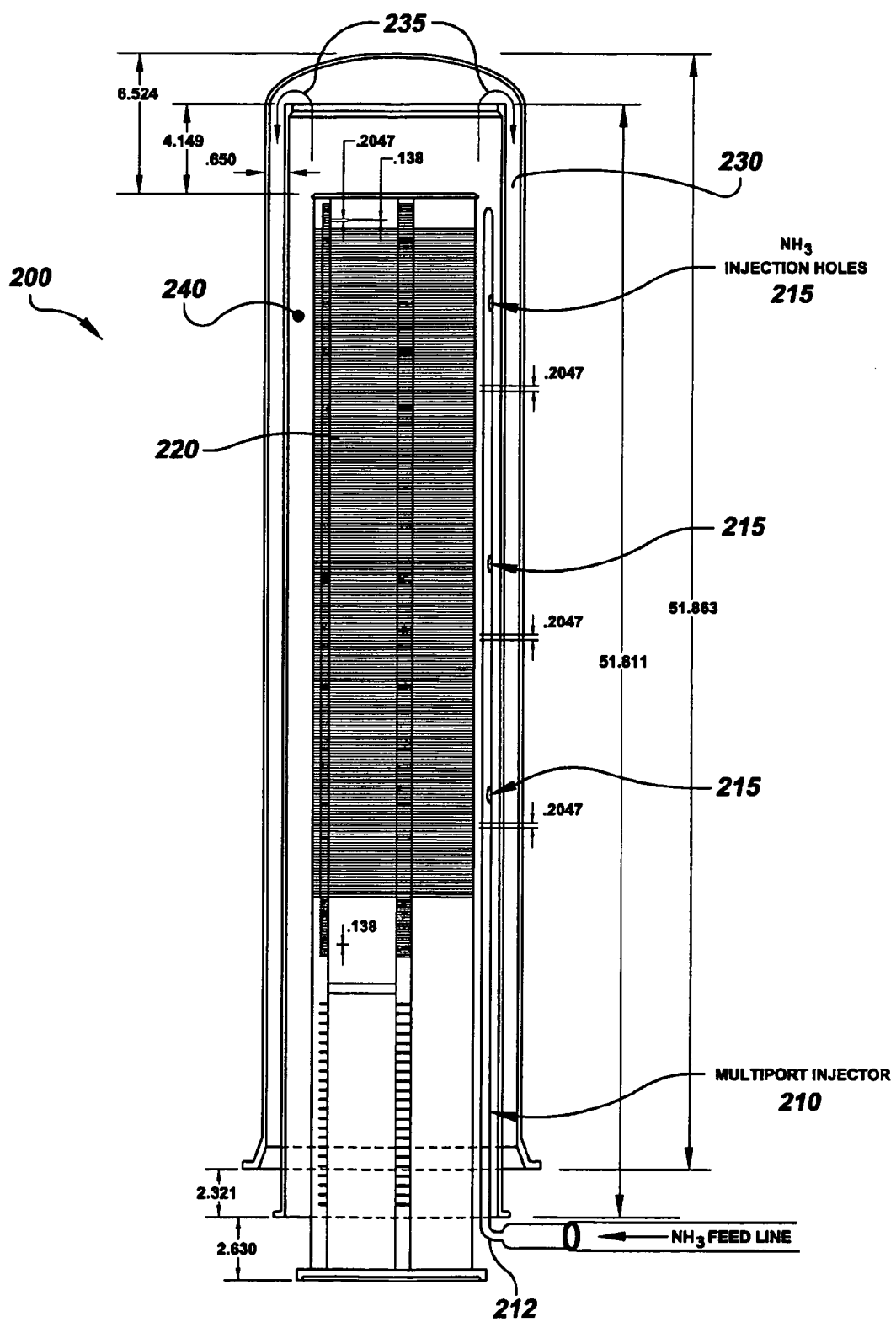
FIG. 1 is a CVD system employing a gas injector, according to an example embodiment of the present invention.

While the invention is amenable to various modifications and alternative forms, specifics thereof have been shown by way of example in the drawings and will be described in detail. It should be understood, however, that the intention is not necessarily to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable for a variety of different types of CVD processes, and the invention has been found to be particularly suited for CVD of a uniform coating on a semiconductor wafer. While the present invention is not necessarily limited to such applications, various aspects of the invention may be appreciated through a discussion of various examples using this context.

According to an example embodiment of the present invention, a gas injector is adapted to deliver gas to a CVD arrangement in a manner that facilitates uniform supply of the gas over a surface having a coating formed using CVD. The uniform gas supply is sufficiently maintained to enhance the ability to form coatings having uniform properties, such as thickness, refractive index, and reflectivity. These and other properties depend upon the residence time of the gasses present with the surface being coated. Maintaining a sufficiently uniform gas supply improves the residence time, allowing the supplied gas, combined with selected reactants and conditions, to improve the quality of the deposited film.

The injector is useful in various applications, including systems and methods for forming a coating on a semiconductor wafer, and is particularly useful for low-pressure CVD (LPCVD) applications including thermal applications. For example, a typical thermal LPCVD process involves supplying a reactant gas to wafer surfaces in a deposition chamber. As the supplied gas passes through the chamber towards the exhaust, some of the gas is reacted, resulting in a decreasing amount of reactant gas and an increasing amount of reactant byproducts. This results in a depleted supply gas concentration and, therefore, delivery of less supply gas to wafers located in regions of the chamber near the exhaust. The injector is adapted to compensate for the depleted concentration of supply gas by supplying additional gas to depleted regions. The wafer coating can then be used for subsequent processing, such as for dimensioning circuitry and other structure in the wafer. The uniform distribution of the gas and related uniformity of the coating improve the ability to control subsequent processing, such as photolithography.

Sufficiently maintaining a uniform supply of gas in the CVD arrangement can provide various advantages. For example, the gas concentration can be maintained in a manner that provides a sufficient amount of gas available for reaction at a wafer surface. The provision of sufficient reactant gas makes possible the formation of a coating or coatings having uniform optical properties, such as the index of refraction (n value), extinction coefficient (k value), reflectivity and thickness-related properties. The extinction coefficient represents a measure of how much light is absorbed by the coating. In one implementation, the coating is formed having an extinction coefficient of between about 0.6 and 0.8. In another implementation, the refractive index of the coating, or n value, is maintained between about 2.3 and 2.5, and in another implementation, the n value throughout the coating has a variation of less than about 20%. In still another implementation, the gas concentration is sufficiently maintained to form a coating having a thickness that has a variation of less than about 6%.

In one particular example embodiment of the present invention, a quartz injector is adapted for supplying gas (e.g., ammonia (NH3), dichlorosilane or other reactants) to a LPCVD process. A silicon rich nitride optical anti-reflective coating is deposited on a semiconductor wafer in a CVD reactor. The coating is useful, for example, to control Polysilicon gate dimensions in the manufacture of high speed, high performance integrated logic circuits. The injector makes possible the uniform delivery of and the development of a uniform pressure field for high purity ammonia or other selected reactant in the CVD reactor. One advantage of this injector device is gained by the ability to deliver ammonia to zones in the reactor that are, using existing technology, currently depleted in ammonia due to the reaction of the ammonia in previous zones. As a result, optical properties, such as the refractive index and k values, of the silicon rich nitride film deposited are much more uniform across the reactor. Therefore, control of gate dimensions of polysilicon and other features formed during subsequent operations is improved.

FIG. 1 is an example CVD arrangement 200 that addresses depletion problems including those discussed in connection with the Background hereinabove, according to an example embodiment of the present invention. Semiconductor wafers 220 are located in the device, and a gas is supplied via the injector 210. Gas including reactant byproducts is exhausted by an exhaust pump as indicated by arrows 235. The exhaustion of the gas results in an increased velocity of gas being removed and would, absent the injector, form depletion regions in the device and cause problems in the CVD process. For example, without the injector, coatings formed using CVD on the wafers located near the exhaust may exhibit properties different from those wafers located away from the exhaust. In addition, individual wafers may exhibit variations in properties due to an uneven distribution of gas over the wafer.

The injector 210 has injection outlets 215 and is adapted to provide a uniform supply of gas to the wafers 220. The injection outlets are selected to make up for regions of the CVD arrangement that would exhibit gas depletion, absent the injector. It has been discovered that, by supplying gas using the injection outlets 215, a uniform supply of gas is supplied to the wafers, making possible the application of CVD coatings on the wafers 220 that exhibit uniform properties.

Figure 2:
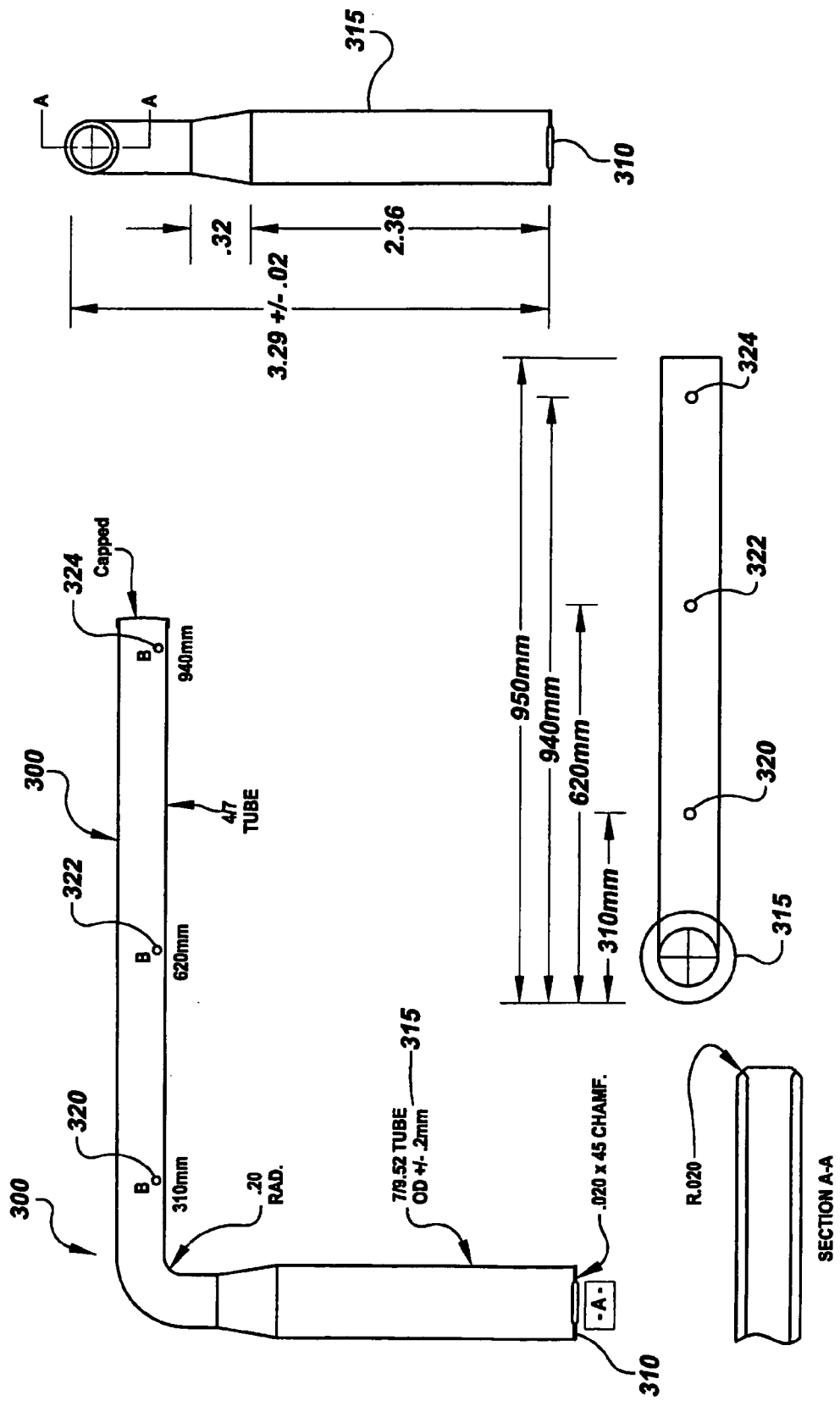
FIG. 2 is a three-port gas injector, according to another example embodiment of the present invention.

FIG. 2 shows a more particular example embodiment of the present invention including an injector 300 adapted to maintain a uniform gas supply to a CVD arrangement, such as that shown in FIG. 1. The injector has an inlet 310 and a plurality of outlets 320, 322, and 324. Gas is supplied to the inlet 310, through a supply tube 315 and out of the outlets into a CVD arrangement. The shape of the supply tube and each outlet is selected to enhance the uniformity gas supplied to a surface or surfaces of semiconductor wafers undergoing CVD processing.

In one example implementation, the injector in FIG. 2 is used in the CVD arrangement of FIG. 1, and has the following characteristics: the supply tube has a diameter of between about 7 mm and 9 mm and extends into the CVD arrangement to about 950 mm; the outlets 320, 322 and 324 are located at distances of about 320 mm, 620 mm and 940 mm from the entrance 212 to the CVD arrangement.

Uniform gas supply is made possible because of the outlet selection on the injector where gas is delivered from the outlet or outlets at points in the reactor where gas, such as ammonia, is depleted. The present invention is particularly useful for controlling the supply of reactant gas, such as ammonia or dichlorosilane, to LPCVD processes involving the deposition of a coating on one or more semiconductor wafers. For example, in many CVD processes, ammonia is a primary reactant that controls coating properties including refractive index and k optical values. Since the system operates under low pressure, the reactor zone that is closest to the vacuum port develops an increased velocity of reactant gas and therefore reduces the residence time of the reactant gas or gasses at the surface. In addition, the gas reaching the wafers near the exhaust commonly has a lower concentration of reactant gas due to reactions occurring with other wafers. This depletion in gas supply and subsequent reduction in residence time adversely affects optical properties, (e.g. n, k parameters). This method of injection increases reactant gas supply in depleted zones, thereby raising the residence time of the reactant at the surface and hence slows the depletion affects, permitting uniform thickness and optical properties.

In another example embodiment of the present invention, the injector is positioned in the CVD arrangement so that the outlet or outlets face the reactor tube wall. Referring again to FIG. 1, the outlets shown face a wall 230 of the CVD arrangement. It has been discovered that, by arranging the outlets so that they face the reactor tube wall, surface defects on the surface of wafers being processed are reduced.

Various other positions and arrangements of the injector in a CVD arrangement can be used. For example, a plurality of injectors can be placed in a CVD system. By using more than one injector, the uniformity of the gas supplied may be enhanced. Referring again to FIG. 1, one or more injectors may be inserted into different portions of the CVD arrangement, such as in region 240. In addition, the placement of the injector or injectors can be adapted for particular CVD arrangements, depending on the portions of the CVD reactors that exhibit gas depletion.

Figure 3:
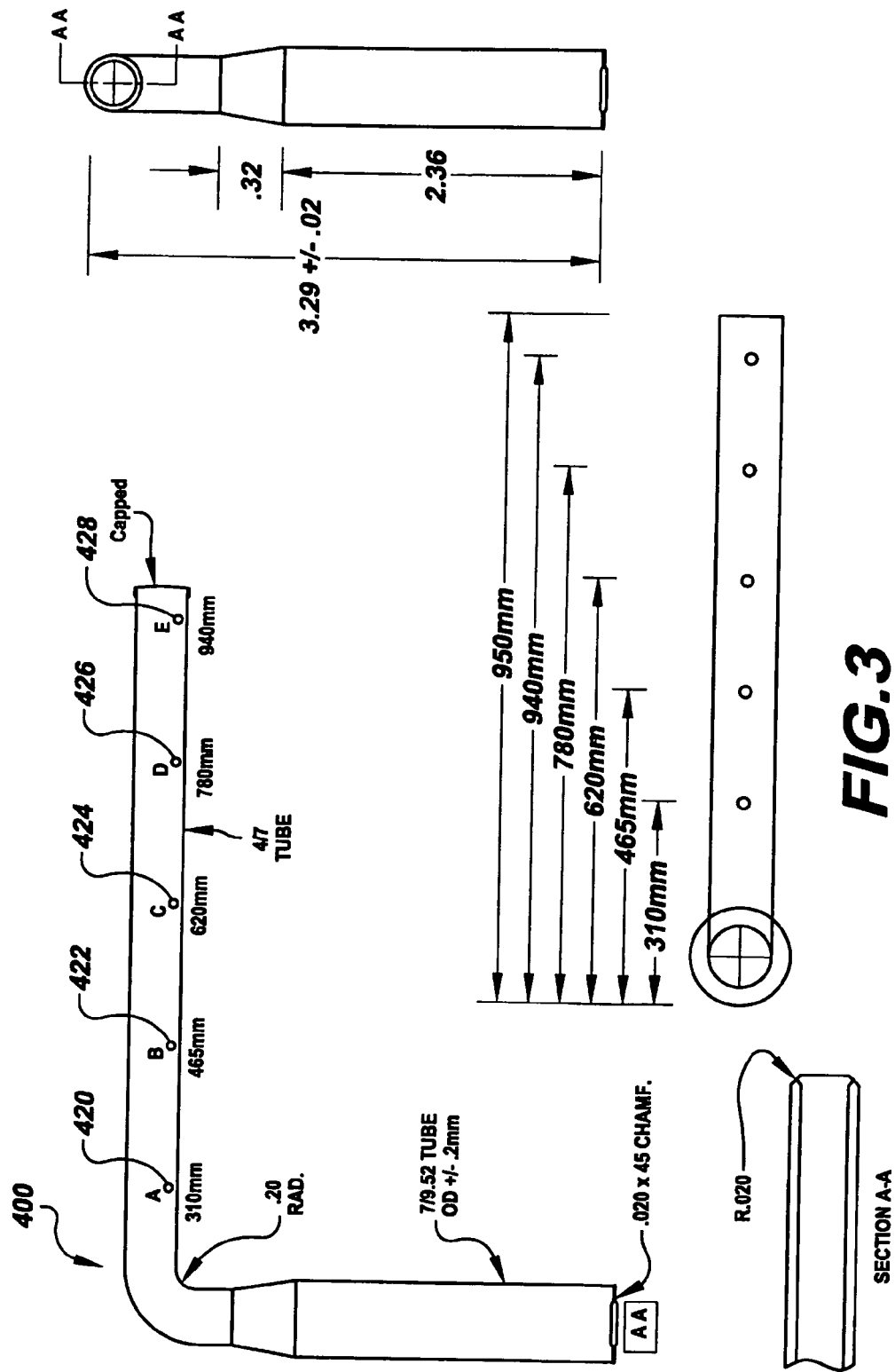
FIG. 3 is a five-port gas injector, according to another example embodiment of the present invention.
Figure 4:
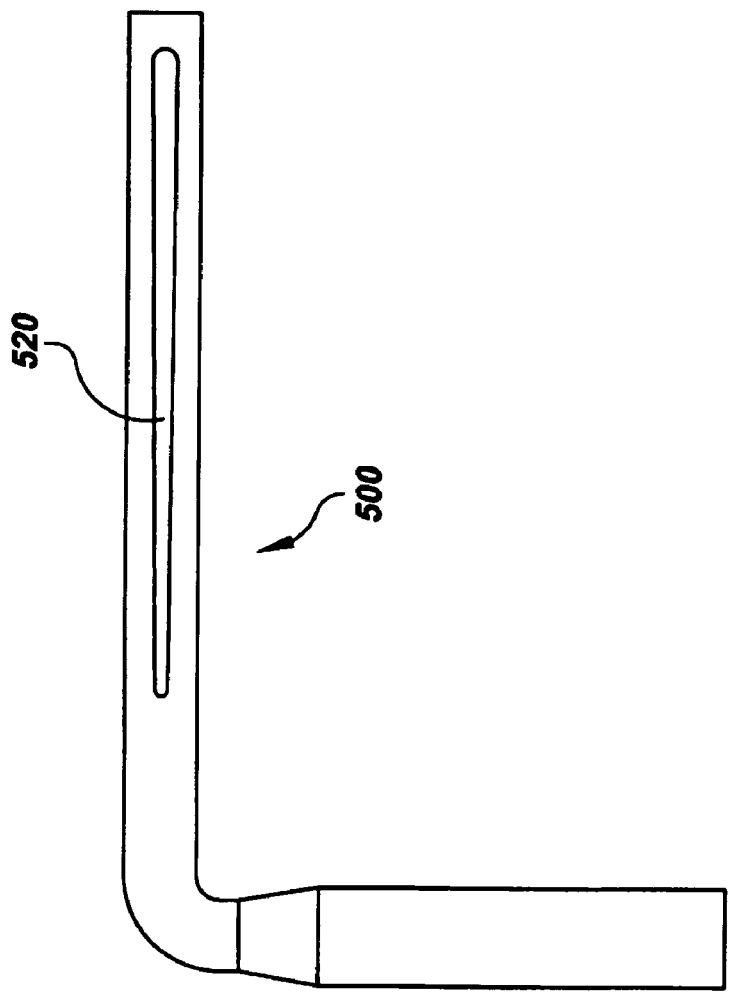
FIG. 4 is a gas injector having a variable outlet, according to another example embodiment of the present invention.

The shape, number, and location of injector outlets can also be selected to accommodate various CVD depletion areas. FIG. 3 shows one example implementation where the injector 400 includes five injector outlets 420, 422, 424, 426 and 428. FIG. 4 shows another example implementation where the injector 500 has an outlet 520 that varies in shape along the length of the injector. Various other combinations and implementations of outlet shapes consistent with the present invention may be selected to address depletion problems as needed.

In another example embodiment of the present invention, the outlets are adjustable. The adjustment of the outlets are selected based upon items such as the CVD chamber size, the process for which the injector is being used, the desired flow rate of the gas and the type of gas that is being supplied. Various parameters, such as temperature, density, and pressure of the gas; chamber size and shape; desired coating properties; type and quantity of substrate or wafers that are to be coated; and others can be accommodated by the adjustable outlets.

In another example embodiment of the present invention, one or more gas concentration detectors are used to detect the concentration of gas in the CVD chamber. The detected concentration is used to select the shape of the injector outlets in a manner that improves the uniformity of gas at a surface or surfaces being coated. The adjustment of the outlets can be achieved in various manners, including using manual and automatic methods. In one implementation, the detector is communicatively coupled to a controller that is adapted to control the adjustment of the outlets. A feedback loop is used at the controller to adjust the outlets in response to the detected gas concentration. The feedback can be used during processing to dynamically monitor the gas concentration. The detector is placed in an area or areas of the CVD chamber for which gas concentration is to be monitored.

In one implementation, gas concentration detectors are used in the chamber prior to processing semiconductor wafers under simulated process conditions. The detectors are placed in selected locations to detect reactant concentrations, and the CVD chamber is operated under conditions similar to actual process conditions. Reactant gas is supplied and the resulting concentrations in selected portions of the chamber are detected. This can be accomplished in a manner that enables the use of conventional detectors, such as without performing deposition and without reaching process temperatures. The detected concentrations are then used to set parameters, such as the injector type, hole size or flow rate to enhance the CVD process.

While the present invention has been described with reference to several particular example embodiments, those skilled in the art will recognize that many changes may be made thereto without departing from the spirit and scope of the present invention, which is set forth in the following claims.

What is claimed is:

1. An improved system for forming a coating on a surface of a semiconductor wafer in a zone within a CVD arrangement of the type in which the zone is located near an exhaust and is thereby susceptible to gas supply depletion, the system characterized in that the system further comprises:
   injector means for supplying a uniform supply of gas to the surface of the wafer and for mitigating gas supply depletion in the zone; and
   means for using the supplied gas in combination with selected reactants to deposit a coating on the wafer.

2. In a method for forming a coating on a surface of a semiconductor wafer in a zone within a CVD arrangement of the type in which the zone is located near an exhaust and is thereby susceptible to gas supply depletion, the method characterized in that the method further comprises:
   supplying gas to the surface of the wafer using a gas injector adapted to maintain uniform supply of the gas and mitigate gas supply depletion in the zone; and
   using the supplied gas in combination with selected reactants and depositing a coating on the wafer.

3. The method of claim 2, wherein supplying gas to the surface includes supplying gas in different quantities to different zones of the CVD arrangement.

4. The method of claim 3, wherein the different quantities are selected to compensate for a gas depletion rate associated with the selected zone of the CVD arrangement to which the injector supplies gas.

5. The method of claim 2, wherein the gas includes at least one of: ammonia and dichlorosilane.

6. The method of claim 2, wherein depositing a coating on the wafer includes depositing an anti-reflective coating having uniform optical properties.

7. The method of claim 6, wherein the anti-reflective coating is deposited having a k value of refractive index that is between about 0.6 and 0.8.

8. The method of claim 6, further comprising performing photolithography on the wafer using the anti-reflective coating.

9. The method of claim 2, wherein depositing a coating on the wafer includes depositing a coating having uniform thickness.

10. The method of claim 2, further comprising adjusting the gas injector to maintain the uniform gas supply.

11. The method of claim 10, wherein adjusting the gas injector comprises:
- providing at least one gas concentration detector in the CVD arrangement;
- detecting the concentration of the supplied gas using the detector; and
- in response to the detected concentration, adjusting the gas injector.

12. The method of claim 11, prior to depositing a coating on the wafer, further comprising removing the at least one gas concentration detector from the CVD arrangement after detecting the concentration of the supplied gas.

13. The method of claim 12, wherein detecting the concentration of the supplied gas using the detector includes operating the CVD arrangement under simulated processing conditions.

* * * * *